(12) United States Patent
Zhang et al.

(10) Patent No.: US 10,665,749 B2
(45) Date of Patent: May 26, 2020

(54) MANUFACTURING METHOD OF QUANTUM DOT STRUCTURE

(71) Applicant: QINGDAO YICHENLEISHUO TECHNOLOGY CO., LTD, Qingdao, Shandong Province (CN)

(72) Inventors: Ziyang Zhang, Suzhou (CN); Rong Huang, Suzhou (CN); Yuanqing Huang, Suzhou (CN)

(73) Assignee: QINGDAO YICHENLEISHUO TECHNOLOGY CO., LTD, Qingdao (CN)

( * ) Notice: Subject to any disclaimer, the term of this patent is extended or adjusted under 35 U.S.C. 154(b) by 0 days.

(21) Appl. No.: 16/340,108

(22) PCT Filed: Dec. 30, 2016

(86) PCT No.: PCT/CN2016/113894
§ 371 (c)(1),
(2) Date: Apr. 6, 2019

(87) PCT Pub. No.: WO2018/064869
PCT Pub. Date: Apr. 12, 2018

(65) Prior Publication Data
US 2020/0028026 A1    Jan. 23, 2020

(30) Foreign Application Priority Data

Oct. 8, 2016 (CN) .......................... 2016 1 0876764

(51) Int. Cl.
*H01L 33/06* (2010.01)
*H01L 33/00* (2010.01)
(Continued)

(52) U.S. Cl.
CPC .......... *H01L 33/06* (2013.01); *H01L 33/0062* (2013.01); *H01L 33/0095* (2013.01); *H01L 33/30* (2013.01); *H01L 33/44* (2013.01); *H01S 5/0206* (2013.01); *H01S 5/028* (2013.01); *H01S 5/343* (2013.01); *H01S 5/3412* (2013.01); *H01L 2933/0025* (2013.01)

(58) Field of Classification Search
None
See application file for complete search history.

(56) References Cited

U.S. PATENT DOCUMENTS

2010/0117110 A1    5/2010  Park et al.
2020/0028026 A1*   1/2020  Zhang .................... H01L 33/44

FOREIGN PATENT DOCUMENTS

CN    101413110 A    4/2009
CN    101752482 A    6/2010
(Continued)

*Primary Examiner* — Jack S Chen
(74) *Attorney, Agent, or Firm* — Maschoff Brennan

(57) ABSTRACT

The present disclosure discloses a manufacturing method of a quantum dot structure including: providing a quantum dot film layer on a substrate; providing a first protection film on the quantum dot film layer; providing a patterned array on the first protection film; providing a second protection film on the first protection film and the patterned array to obtain an intermediate body; and performing an annealing process on the intermediate body to obtain the quantum dot structure on the substrate.

12 Claims, 6 Drawing Sheets

(51) Int. Cl.
    *H01L 33/30*     (2010.01)
    *H01L 33/44*     (2010.01)
    *H01S 5/02*     (2006.01)
    *H01S 5/028*     (2006.01)
    *H01S 5/34*     (2006.01)
    *H01S 5/343*     (2006.01)

(56) References Cited

FOREIGN PATENT DOCUMENTS

| | | |
|---|---|---|
| CN | 101830430 A | 9/2010 |
| CN | 103137789 A | 6/2013 |
| CN | 104835783 A | 8/2015 |
| WO | 2008121793 A1 | 9/2008 |

* cited by examiner

MANUFACTURING METHOD OF QUANTUM DOT STRUCTURE

TECHNICAL FIELD

The present disclosure belongs to a technical filed of a semiconductor quantum dot and manufacturing thereof, and particularly relates to a manufacturing method of a quantum dot structure.

BACKGROUND ART

The quantum information technology is one of front and significant research directions in the physics field, and implementing quantum calculation and quantum communication based on a single photon state manipulation is the most important physic implementing method of the current quantum information technology. However, an ideal single photon emission device lacks at present. Thus, for now, experiment demonstrations of the quantum key communication all simulate a single photon emission by attenuated laser light source, but such experiments need a extremely complicated optical system, and a generation efficiency of a single photon is very low, it is impossible to eliminate existence of multiple-photon, and a possibility of being attacked by the multiple-photon cannot be avoided. This will bring a security risk to the quantum communication, for example, an eavesdropper may eavesdrop through a Photon-Number-Splitting (PNS) method. Thus, how to obtain a stable, highly effective and reliable single photon source has become a bottleneck problem in applications of the quantum communication and a quantum cryptography.

A semiconductor quantum dot structure will be encountered with a very strong three dimensional quantum confinement effect since sizes thereof in X, Y and Z directions are between a few nanometers and a few tens of nanometers, energy level distributions thereof presents a shape of a hydrogen-like spectrum, and it has a typical "atom-like" structure; moreover, the semiconductor quantum dot structure further has advantages such as a large tunable wavelength range, easy integration, and the like, and thus, it becomes one of ideal choices for manufacturing a single photon emission device.

However, it is very difficult to grow a quantum dot structure of which a density, a size and a position can be controlled by using a quantum dot growth process in a traditional Stranski-Krastanow mode (which is called an SK mode for short). In order to solve this problem, recently adopting a technology of epitaxially growing a quantum dot structure on a nano-patterned substrate is widely focused, but these methods not only have tedious processes, but also have larger damages on the substrate, which is not benefit to obtain a quantum dot structure with a high quality.

SUMMARY

In order to solve the above problem existing in the prior art, the present disclosure provides a manufacturing method of a quantum dot structure, and the manufacturing method adopts a annealing process for a region selected by a template, thereby obtaining the quantum dot structure in which a density and a position of quantum dots can be controlled.

In order to achieve the above inventive purpose, the present disclosure adopts the following technical solutions:

A manufacturing method of a quantum dot structure including: providing a quantum dot film layer on a substrate; providing a first protection film on the quantum dot film layer; providing a patterned array on the first protection film; providing a second protection film on the first protection film and the patterned array to obtain an intermediate body; and performing an annealing process on the intermediate body to obtain the quantum dot structure on the substrate.

Furthermore, a material of the patterned array is selected from any one of $TiO_2$, Al, $HfO_2$, $Si_3N_4$ and $SrTiO_3$; and a thickness of the patterned array is 40 nm~300 nm, and a length and/or width of the patterned array is 10 nm~10 μm.

Furthermore, materials of the first protection film and the second protection film each are $SiO_2$; and a thickness of the first protection film is 5 nm~50 nm, and a thickness of the second protection film is 50 nm~300 nm.

Furthermore, an annealing temperature for performing an annealing process on the intermediate body is 550° C.~1000° C., and annealing time is 30 s~10 min.

Furthermore, a material of the quantum dot film layer is selected from any one of InAs, InGaAs, InGaAlAs, InSb, GaSb and InP; a growing temperature of the quantum dot film layer is 300° C.~550° C.; a thickness of the quantum dot film layer is 1.4 ML~10 ML; and a density of a quantum dot in the quantum dot film layer is $10^8$ $cm^{-2}$~$10^{11}$ $cm^{-2}$.

Furthermore, the method of providing the patterned array on the first protection film specifically includes: providing a precursor film layer on the first protection film; performing a patterned process on the precursor film layer by a laser direct writing process, the precursor film layer forming the patterned array and a precursor residual film surrounding around the patterned array; and peeling off the precursor residual film to form the patterned array on the first protection film.

Furthermore, a material of the precursor film layer is Ti; a thickness of the precursor film layer is 40 nm~300 nm; and a length and/or width of the graphic array is 100 nm~500 nm.

Furthermore, the method of providing the patterned array on the first protection film specifically includes: providing a photoresist layer on the first protection film; performing a patterning process on the photoresist layer by a photolithography process or an electron beam photolithography process, to form a concave hole matching with a shape of the patterned array; depositing a patterned film layer in the concave hole; and peeling off the photoresist layer to form the patterned array on the first protection film.

Furthermore, a material of the patterned film layer is selected from any one of $TiO_2$, Al, $HfO_2$, $Si_3N_4$ and $SrTiO_3$; a thickness of the patterned film layer is 40 nm~300 nm; a length and/or a width of the patterned array is 200 nm~10 μm when performing a patterning process on the photoresist layer by a photolithography process; and a length and/or a width of the patterned array is 10 nm~200 μm when performing a patterning process on the photoresist layer by an electron beam photolithography process.

Furthermore, a material of the substrate is selected from any one of GaAs, GaSb and InP.

Advantageous Effects (1) The process procedure is simplified, and the process for manufacturing the quantum dot structure is optimized. The present disclosure provides a patterned array as a template, manufactures a sequential quantum dot structure by annealing process for a region selected by the template, and adopts a subsequent heat treatment process. Compared with the manufacturing method of a quantum dot structure in the prior art, a damage for a surface of the substrate is avoided, and a whole surface of the substrate is benefit to reduce defects of the quantum dot structure introduced in a growth procedure thereof, thereby improving performance of the quantum dot structure.

(2) Quantum dots of which a density can be controlled is manufactured, and thereby performance of the corresponding quantum dot structure is improved, for example, it is possible to apply a quantum dot structure of which a density is low to a single photon device. The present disclosure uses a uniform patterned array as a template pattern, which is benefit to manufacturing a quantum dot structure in which distributions the quantum dots are uniform, thereby being capable of improving performances of quantum dot devices such as the single photon device, a quantum dot laser, and the like.

(3) Controlling an annealing degree may obtain a quantum dot structure with different densities and emission spectrum in different template regions, and it is benefit for application in a wide spectrum device. In the present disclosure, by growing $SiO_2$ thin films with different thicknesses as a first protection film and a second protection film; quantum dot regions with different emission spectrum can be obtained under the same annealing condition; and regulating and controlling the emission spectrum of the quantum further obtain a structure having a wide spectrum property on the same substrate.

DESCRIPTION OF DRAWINGS

The above and/or other aspects, characteristics and advantages of the embodiments of the present disclosure will more apparent, taken in conjunction with the accompanying drawings in which.

DETAILED DESCRIPTION OF THE PREFERRED EMBODIMENTS

Figure 1:
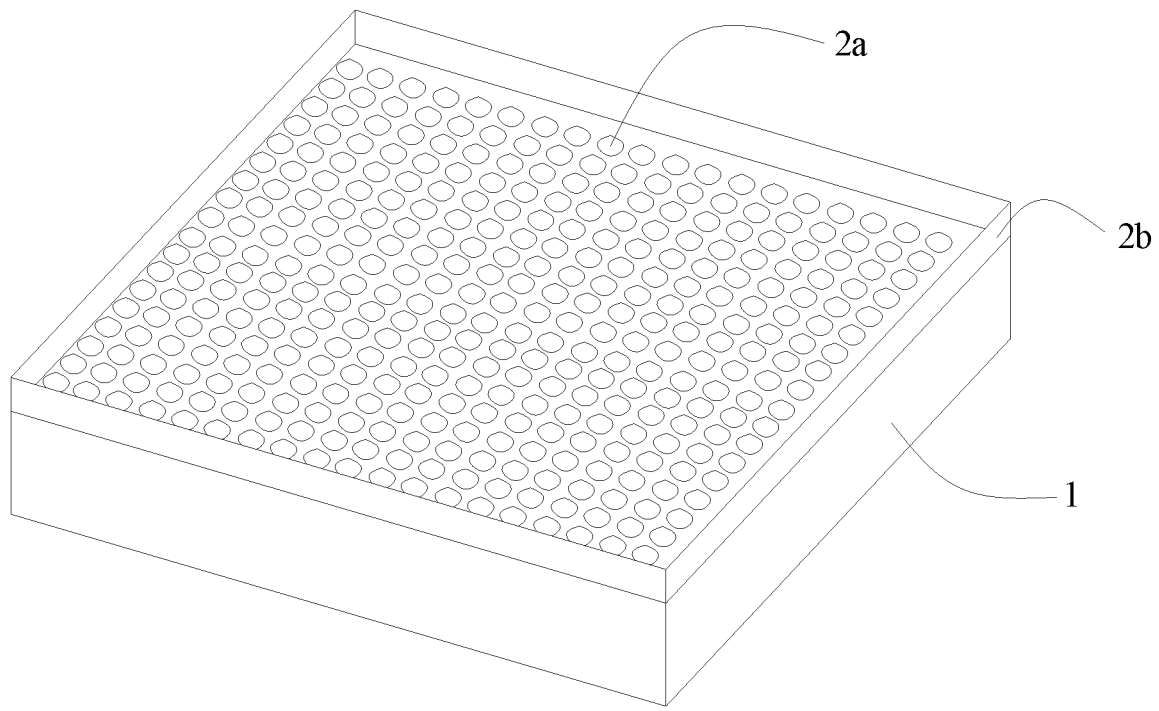
FIGS. 1-7 are process flow charts of a manufacturing method of a quantum dot structure according to Embodiment 1 of the present disclosure.

Embodiments of the present disclosure will be described in detail below by referring to the accompanying drawings. However, the present disclosure can be implemented in many different forms, and should not be construed as limited to the particular embodiments set forth herein. Rather, these embodiments are provided for explaining the principle and actual application of the present disclosure, and thus those skilled in the art can understand various embodiments and amendments which are suitable for specific intended applications of the present disclosure. In the drawings, for clarity, shapes and sizes of components may be exaggerated, and the same reference numerals will be used to indicate the same or similar components throughout.

It will be understood that, even though terms of "first", "second" etc. herein can be used to describe various elements, these elements should not be limited by these terms. The terms are only used to distinguish one element from another element.

Embodiment 1

FIGS. 1-7 are process flow charts of a manufacturing method of a quantum dot structure according to the present embodiment.

Referring to FIGS. 1-7 for details, the manufacturing method of the quantum dot structure according to the present embodiment includes the following steps:

Step 1: providing a quantum dot film layer 2a on a substrate 1.

In specific, in the present embodiment, a material of the substrate 1 is GaAs; a material of the quantum dot film layer 2a is InAs; a thickness of the quantum dot film layer 2a is 1.4 ML~10 ML, preferably is 1.4 ML~5 ML; and a density of quantum dots in the quantum dot film layer 2a is $10^8$ $cm^{-2}$~$10^{11}$ $cm^{-2}$. Here, ML is a monolayer, and is also a thickness of the monolayer.

More particularly, the quantum dot film layer 2a is grown by adopting a molecular beam epitaxy SK mode, and a growing temperature is 300° C.~550° C.; and the specific process of providing the quantum dot film layer 2a by adopting the molecular beam epitaxy SK mode is no longer stated herein, and those skilled in the art may refer to the prior art. It is worth noting that, during the procedure of providing the quantum dot film layer 2a by adopting the molecular beam epitaxy SK mode, there will be a wetting layer 2b, which is formed on the substrate 1, and a quantum dot array in the quantum dot film layer 2a is "embedded" in the wetting layer 2b, as shown in FIG. 1.

Of course, materials of the substrate 1 and the quantum dot film layer 2a are not limited to the GaAs and InAs stated in the present embodiment. The material of the substrate 1 may select GaSb, InP or other semiconductor material substrate, and the material of the quantum dot film layer 2a may also select InGaAs, InGaAlAs, InSb, GaSb, InP, or the like.

Figure 2:
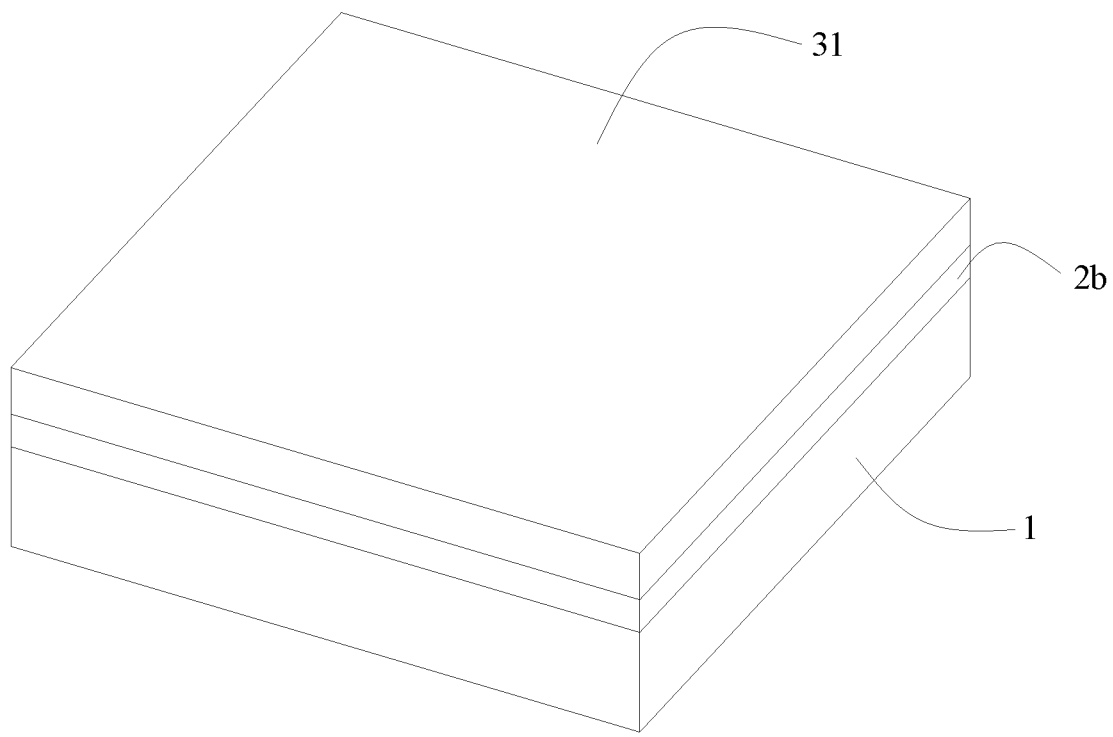

Step 2: providing a first protection film 31 on the quantum dot film layer 2a, as shown in FIG. 2.

In specific, a layer of $SiO_2$ with a thickness of 5 nm~50 nm may be deposited on the quantum dot film layer 2a as the first protection film 31 by selecting a plasma enhanced chemical vapor deposition (which is called PECVD for short) method.

Step 3: providing a patterned array 4 on the first protection film 31.

Figure 3:
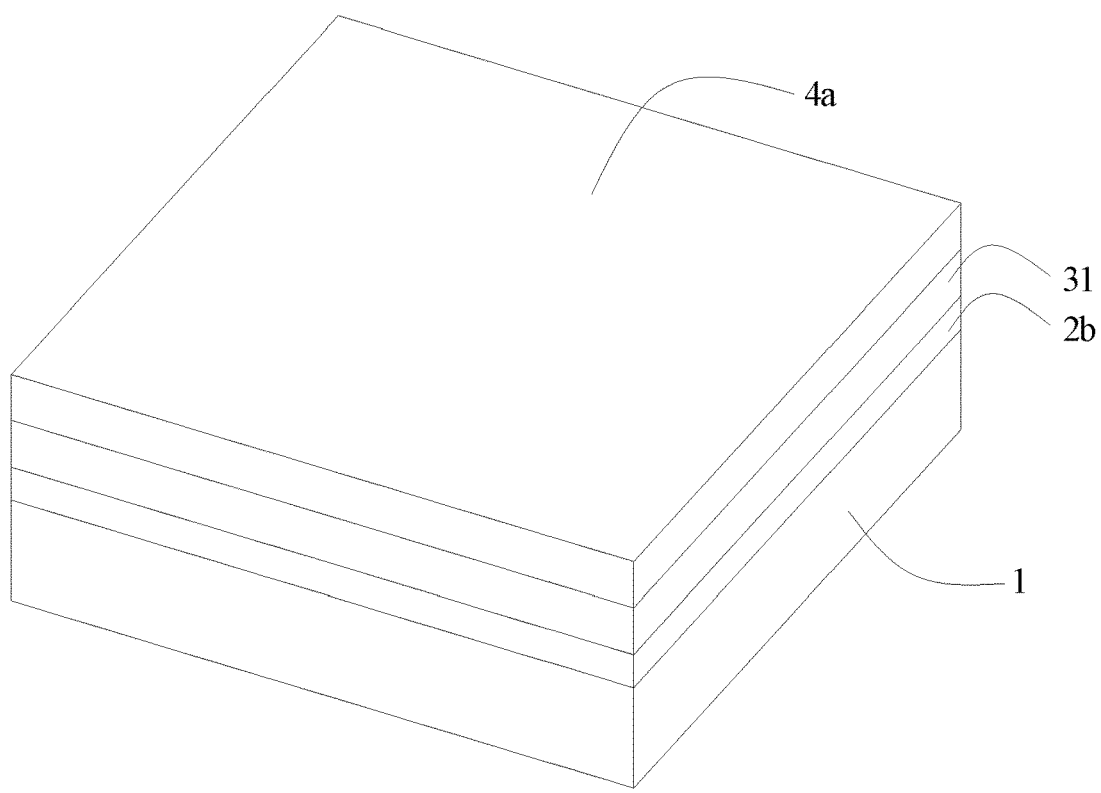
Figure 4:
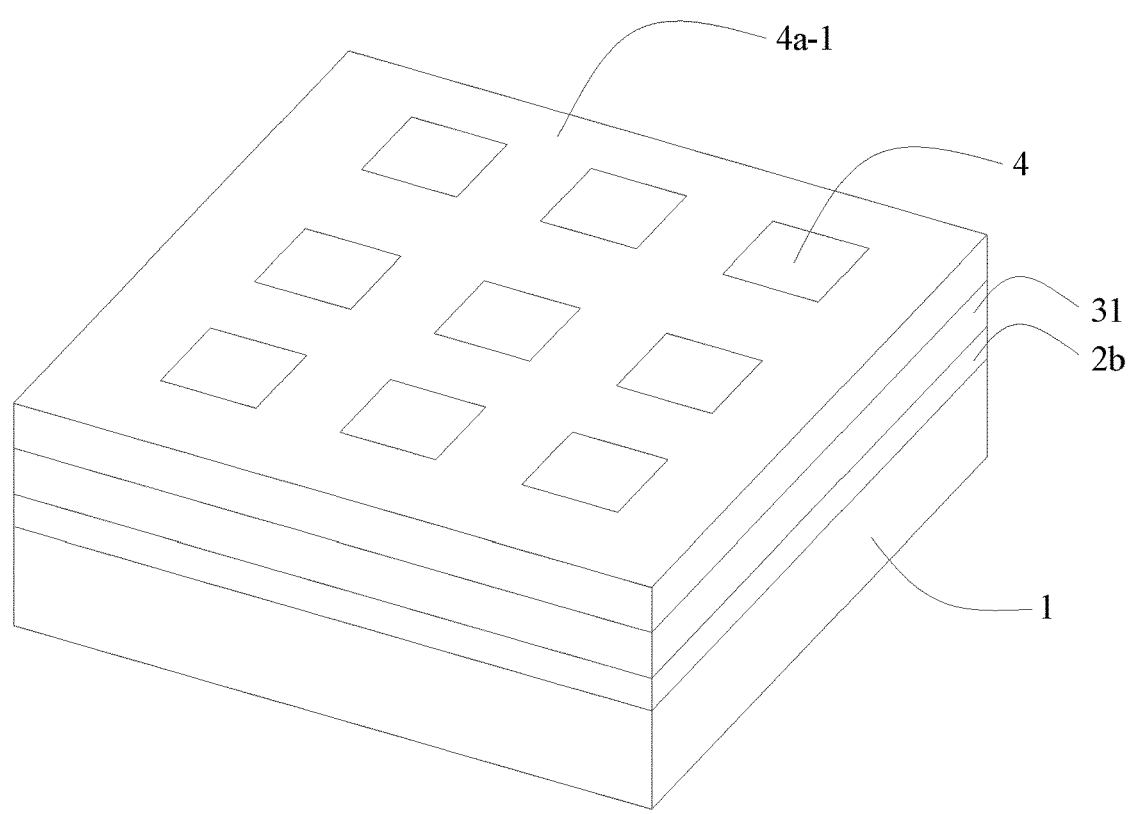
Figure 5:
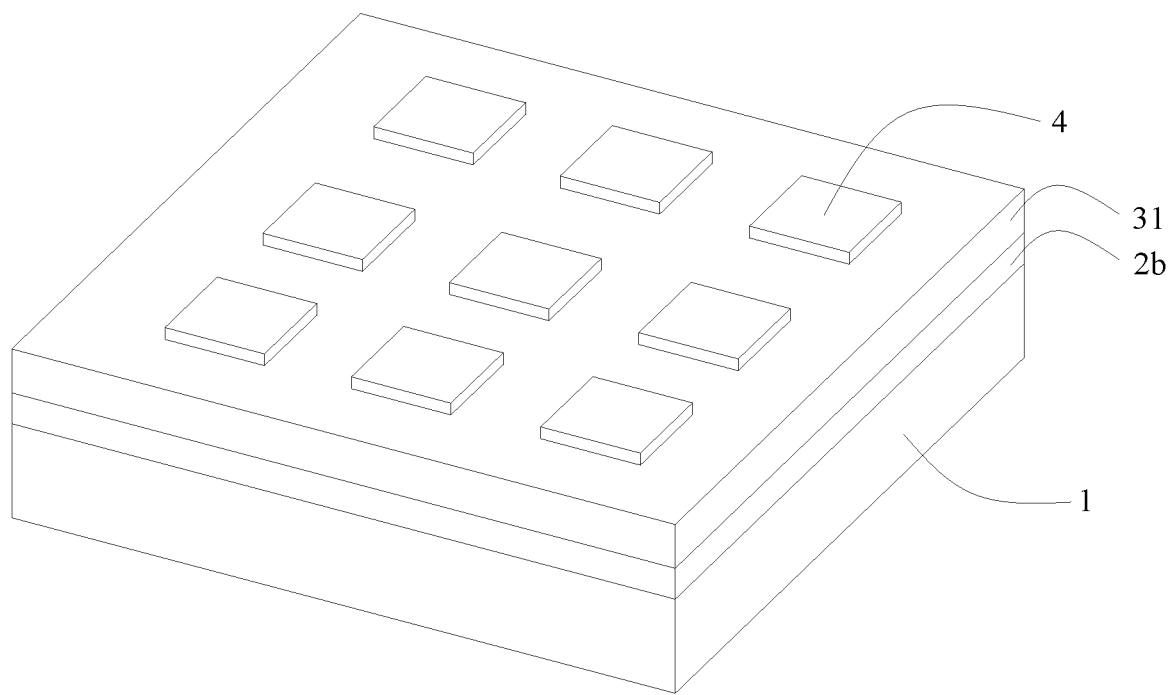

Referring to FIGS. 3-5, the present embodiment manufactures the patterned array 4 on the first protection film 31 by adopting a laser direct writing process.

Specifically, the following steps are referred to: (1) depositing Ti with a thickness of 40 nm~300 nm on the first protection film 31 as a precursor film layer 4a by adopting an electron beam vapor method, as shown in FIG. 3; (2) performing a patterning process on the precursor film layer 4a by adopting the laser direct writing process, and the precursor film layer 4a forming the patterned array 4 and a precursor residual film 4a-1 surrounding around the patterned array 4, as shown in FIG. 4; and (3) after hydrofluoric (HF) acid developing, the precursor residual film 4a-1 being peeled off, that is, forming the patterned array 4 on the first protection film 31, as shown in FIG. 5.

It is worth noting that, during the above procedure of the laser direct writing process, Ti in a patterned region is oxidized to be $TiO_2$, that is, the material of the patterned array 4 which is finally formed is $TiO_2$.

In view of controlling precise of the laser direct writing process, a characteristic size of the patterned array 4 finally obtained is 100 nm~500 nm, that is, a length and/or a width of the patterned array 4 is 100 nm~500 nm. Meanwhile, since the thickness of the above manufactured precursor film layer 4a is 40 nm~300 nm, a thickness of the patterned array 4 finally obtained is also 40 nm~300 nm.

It is worth noting that, Al, $HfO_2$, $Si_3N_4$, $SrTiO_3$ and the like are not suitable for serving as the material of the patterned array 4 when providing the patterned array 4 on the first protection film 31 by adopting the laser direct writing process in the present embodiment.

Figure 6:
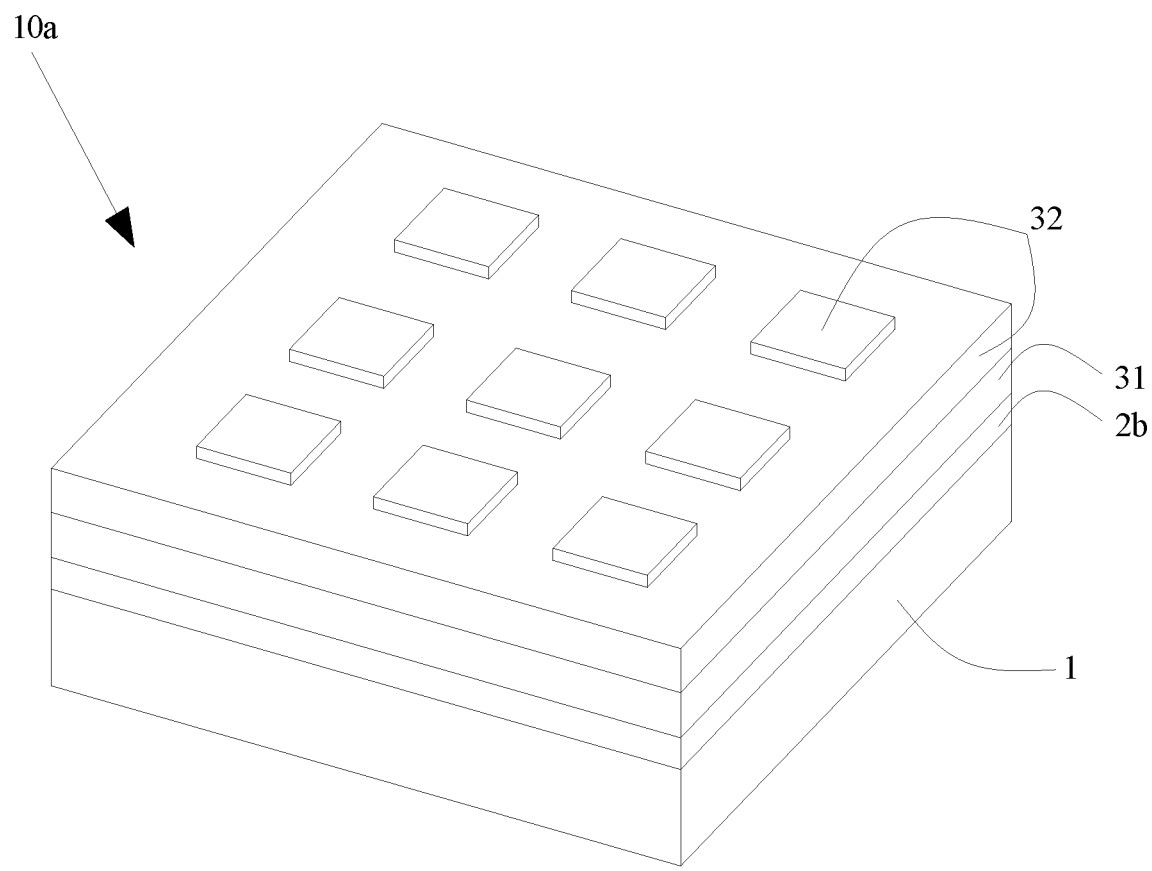

Step 4: providing a second protection film 32 on the first protection film 31 and the patterned array 4 to obtain an intermediate body 10a, as shown in FIG. 6.

Specifically, a layer of $SiO_2$ with a thickness of 50 nm~300 nm is deposited on the first protection film 31 and the patterned array 4 as the second protection film 32 by adopting the PECVD.

Figure 7:
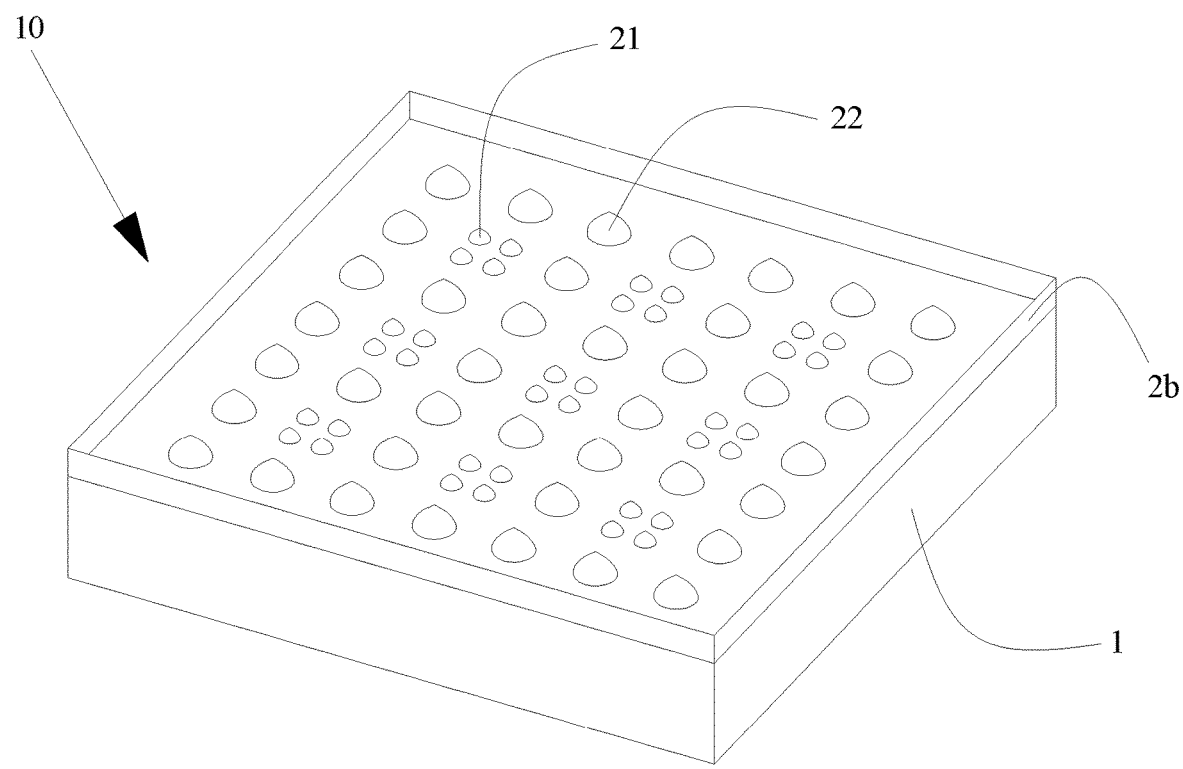

Step 5: performing an annealing process on the intermediate body 10a, and peeling off the first protection film 31, the patterned array 4 and the second protection film 32, to obtain a quantum dot structure 10 on the substrate 1, as shown in FIG. 7.

Specifically, an annealing temperature in the present embodiment is 550° C.~750° C., and annealing time is 30 s~5 min.

It can be seen through operations of the previous Step 1 to Step 4 that the quantum dots in the quantum dot film layer 2a on the substrate 1 is divided into two regions, an upper side of the quantum dots in one region is covered by the first protection film 31, the patterned array 4 and the second protection film 32, and an upper side of the quantum dots in other regions around such a region is only covered by the first protection film 31 and the second protection film 32. During the procedure of annealing the intermediate body 10a, a density of the quantum dot that is not covered by the patterned array 4 becomes low, and with increasing of the annealing time, the quantum dots of which the density tends to be stable will promote mutual mixture and diffusion through high temperature, until disappear. Generally, when the annealing temperature is controlled to be 550° C.~750° C., and the annealing time is controlled to be 30 s~5 min, the quantum dots not covered by the patterned array 4 are mutually mixed and diffused to form a second quantum dot array 22 as shown in FIG. 7, and the quantum dots covered by the patterned array 4 are not changed during the annealing procedure, to form a first quantum dot array 21 as shown in FIG. 7, thereby finally forming a quantum dot structure 10 on the substrate 1.

Embodiment 2

In the description of Embodiment 2, the same point with Embodiment 1 is no longer stated herein, and differences with Embodiment 1 are only described. The manufacturing method of the quantum dot structure in Embodiment 2 differs from that in Embodiment 1 in that specific methods of providing the patterned array 4 on the first protection film 31 in Step 3 are different.

Figure 8:
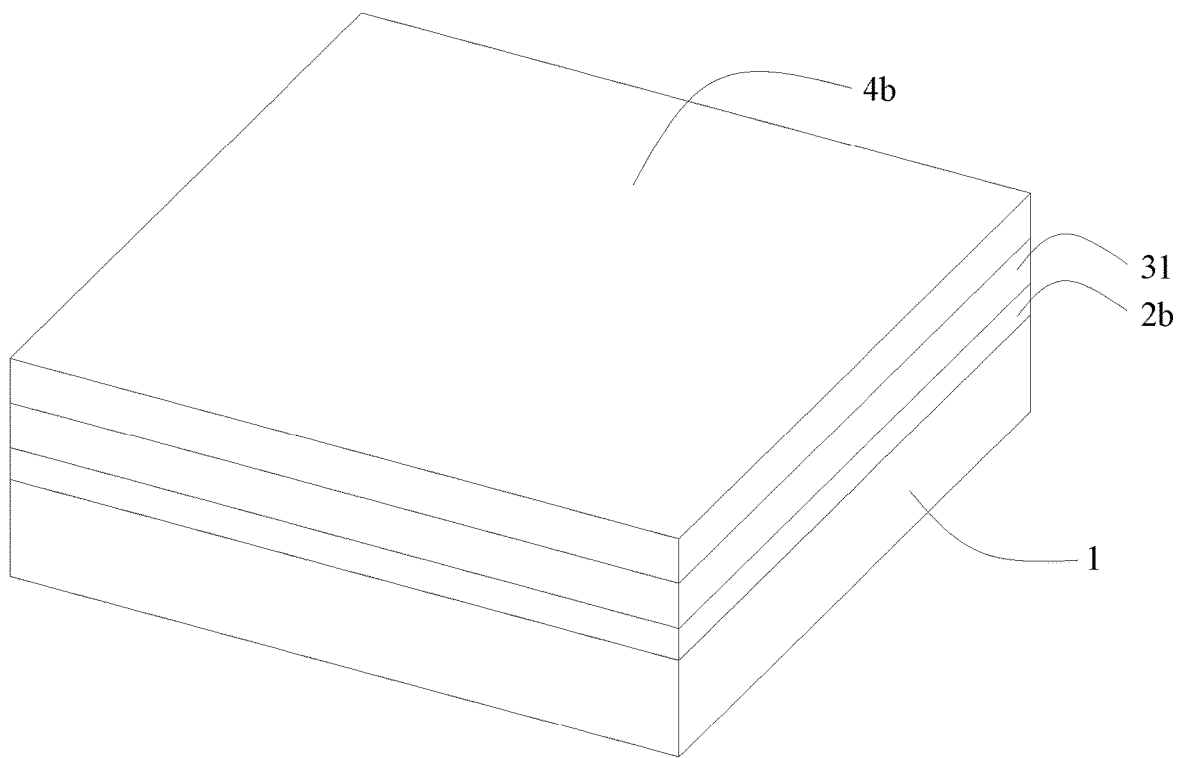
FIGS. 8-10 are process flow charts of a manufacturing method of a quantum dot structure according to Embodiment 2 of the present disclosure.
Figure 9:
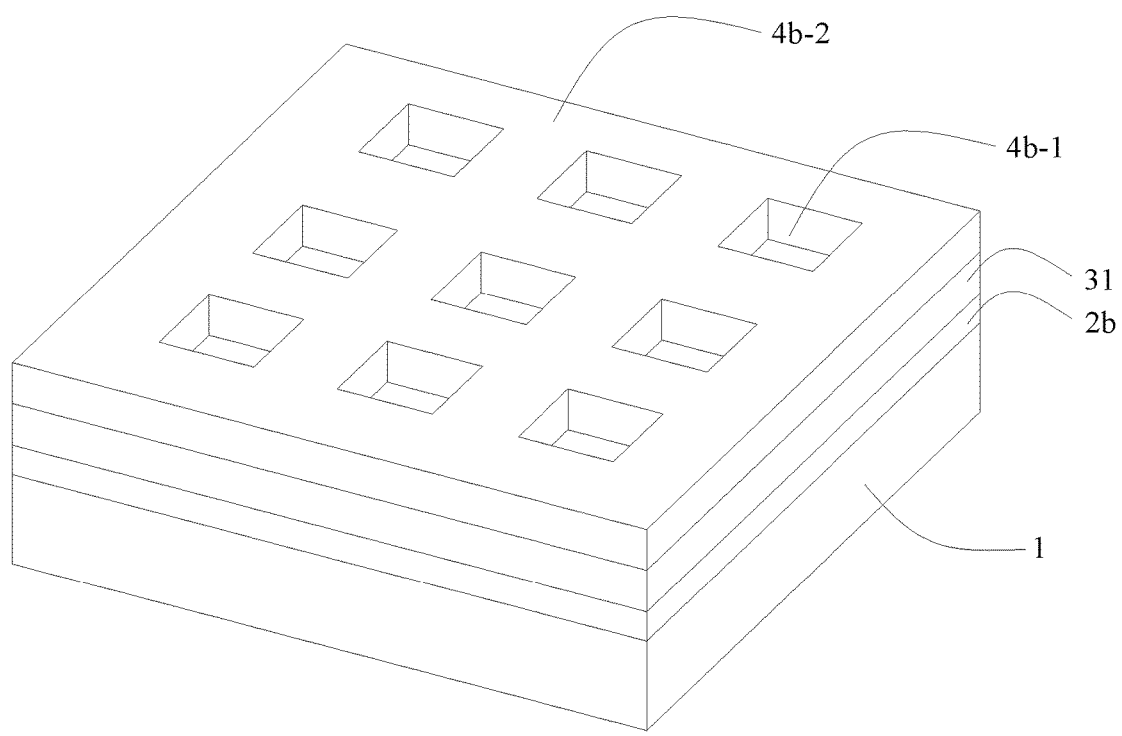
Figure 10:
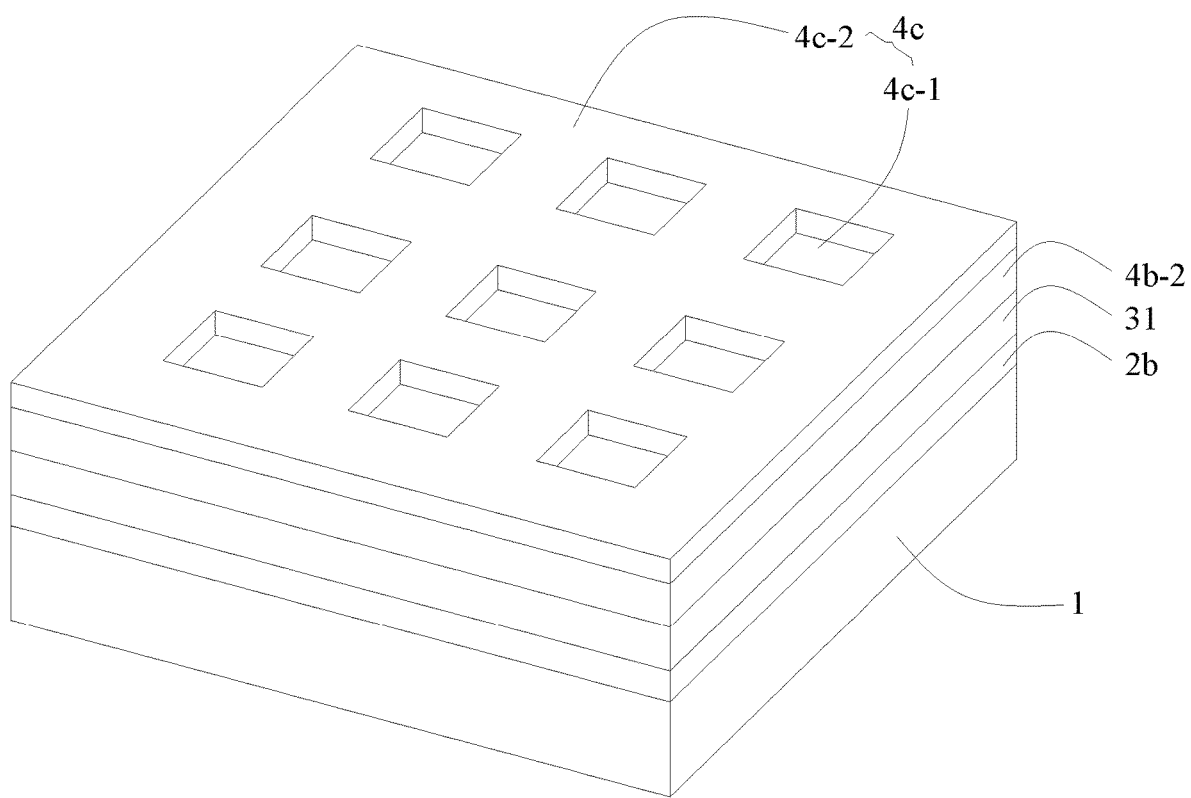

Referring to FIGS. 8-10, the present embodiment manufactures the patterned array 4 on the first protection film 31 by adopting a photolithography process.

Specifically, the following steps are referred to: (1) spin coating a photoresist layer 4b on the first protection film 31 by using a photoresist spinner, as shown in FIG. 8; (2) performing a patterning process on the photoresist layer 4b by adopting a photolithography process, the photoresist layer 4b forming a photolithography adhesive residue 4b-2, meanwhile, a concave hole 4b-1 matching a shape of a pre-manufactured patterned array 4 being formed in the photolithography adhesive residue 4b-2, as shown in FIG. 9; (3) depositing $TiO_2$ with a thickness of 40 nm~300 nm on the photolithography adhesive residue 4b-2 and the concave hole 4b-1 as a patterned film layer 4c by adopting an electron beam vapor process, wherein the patterned film layer covering the photolithography adhesive residue 4b-2 is marked as 4c-1, and the patterned film layer falling within the concave hole 4b-1 and directly covering the first protection film 31 is marked as 4c-2, as shown in FIG. 10; and (4) peeling off the photolithography adhesive residue 4b-2 and the patterned film layer 4c-2 disposed thereon, and the patterned film layer 4c-1 disposed inside the concave hole 4b-1 forming a graph as shown in FIG. 5, that is, forming the patterned array 4 of which the material is $TiO_2$ on the first protection film 31.

Of course, in the present embodiment, the material of the patterned film layer 4c may also be any one of Al, $HfO_2$, $Si_3N_4$ and $SrTiO_3$. Thus, the material of the patterned array 4 is the same as the material of the above patterned film layer 4c.

In view of controlling precise of the photolithography process, a characteristic size of the finally obtained patterned array 4 is 200 nm~10 μm, that is, a length and/or width of the patterned array 4 is 200 nm~10 μm. Meanwhile, since the thickness of the above manufactured patterned film layer 4c is 40 nm~300 nm, a thickness of the finally obtained patterned array 4 is also 40 nm~300 nm.

By referring to the description in Embodiment 1 for the remaining steps, a quantum dot structure 10 as shown in FIG. 7 is finally obtained.

Embodiment 3

In the description of Embodiment 3, the same point with Embodiment 2 is no longer stated herein, and differences from Embodiment 2 are only described. The manufacturing method of the quantum dot structure in Embodiment 3 differs from that in Embodiment 2 in that specific methods of providing the patterned array on the first protection film in Step 3 are different. Meanwhile, the annealing time and the annealing temperature for annealing the intermediate body in Step 5 are different.

Specifically, the present embodiment replaces the photolithography process of step (2) of Step 3 in Embodiment 2 with the electron beam photolithography process so as to perform a patterning process on the photoresist layer.

It is worth noting that, in view of controlling precise of the electron beam photolithography process, a characteristic size of the finally obtained patterned array is 10 nm~200 μm, that is, a length and/or width of the obtained patterned array is 10 nm~200 nm.

Figure 11:
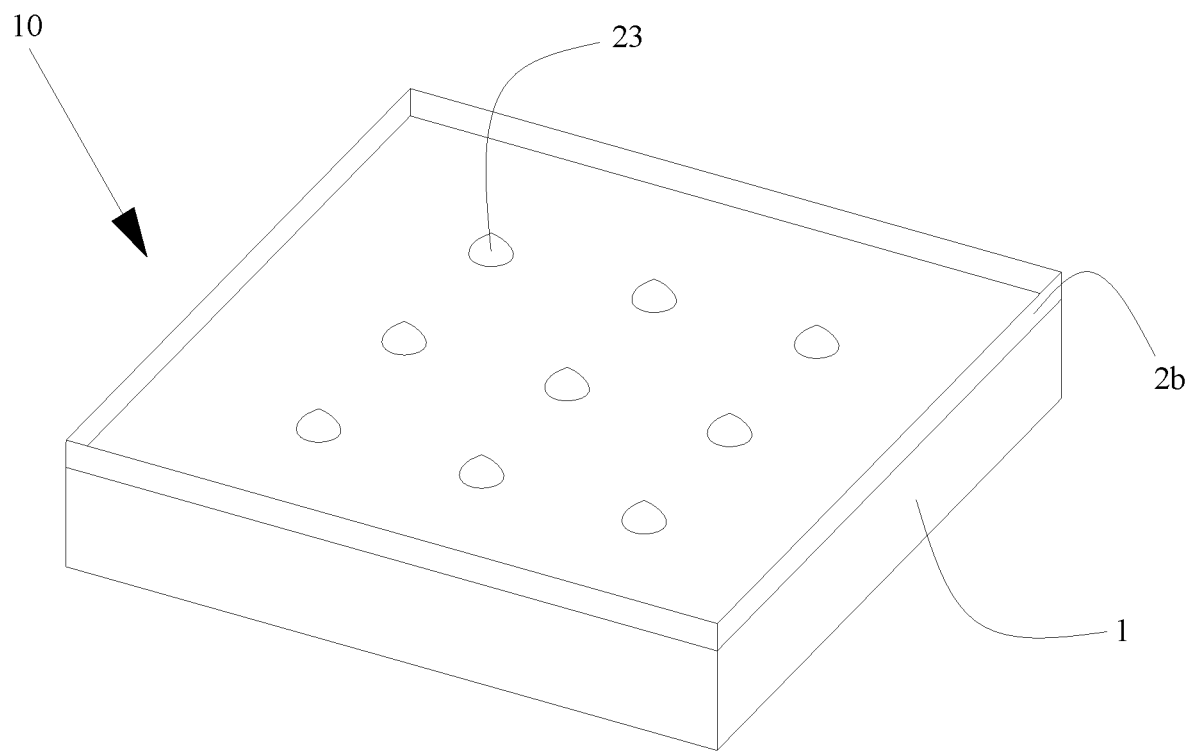
FIG. 11 is a structure diagram of a quantum dot structure obtained according to a manufacturing method of a quantum dot structure according to Embodiment 3 of the present disclosure.

In the present embodiment, the annealing temperature of the intermediate body 10a is 650° C.~1000° C., and the annealing time thereof is 5 min~10 min, and a quantum dot structure 10 is obtained thereby as shown in FIG. 11.

By comparing shapes of the quantum dot structures 10 in FIGS. 7 and 11, it can be seen that the second quantum dot array 22 disappears, and the quantum dots in the first quantum dot array 21 are also mutually mixed and diffused, to form a third quantum dot array 23. This is because the patterned array is manufactured by adopting the electron beam photolithography process in the present embodiment, and the characteristic size of the obtained patterned array is smaller. Since a good protection function cannot be formed on the quantum dot disposed under it, a phenomenon of mutual mixture and diffusion also occurs on a plurality of quantum dots disposed under it, thereby forming a third quantum dot array 23, and since the annealing temperature is higher, and the annealing time is longer, the quantum dots in the region that is not covered by the patterned array are caused to be mutually mixed and diffused seriously and caused to disappear.

Embodiment 4

In the description of Embodiment 4, the same point with Embodiment 1 is no longer stated herein, and differences from Embodiment 1 are only described. Embodiment 4 differs from Embodiment 1 in that, in Step 5, the annealing temperature is 650° C.~1000° C., the annealing time is 5 min~10 min, and a quantum dot structure 10 is obtained thereby as shown in FIG. 12.

Figure 12:
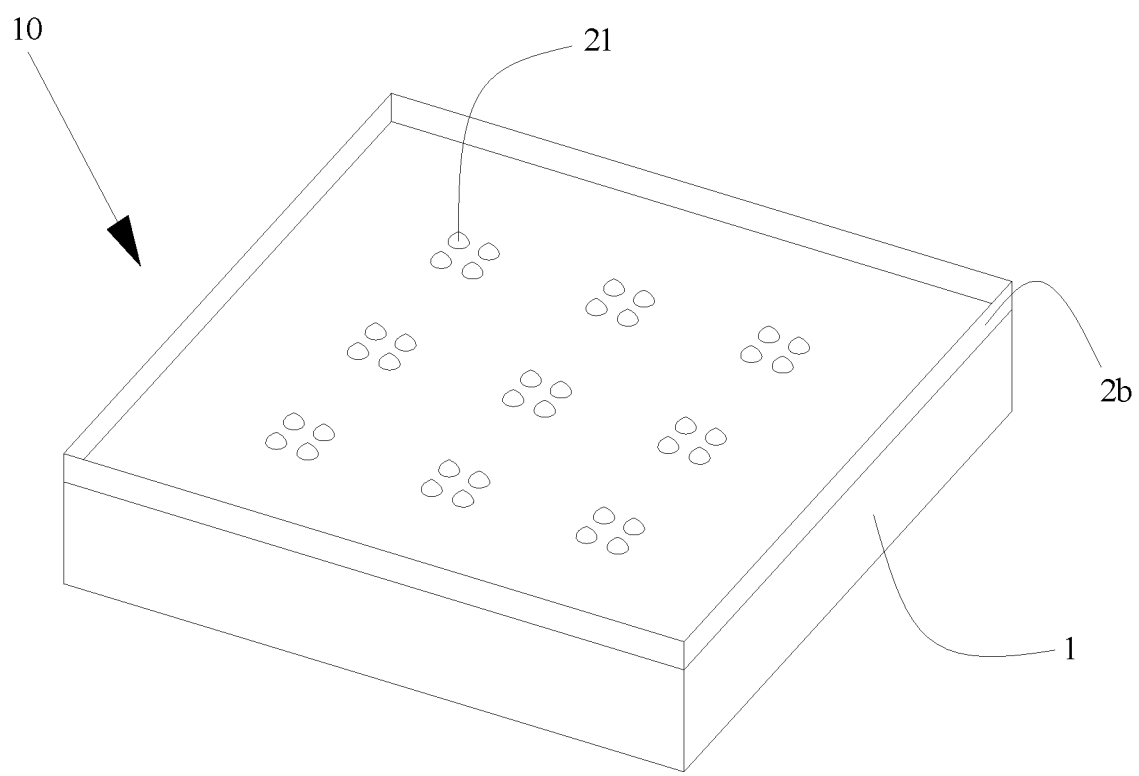
FIG. 12 is a structure diagram of a quantum dot structure obtained according to a manufacturing method of a quantum dot structure according to Embodiment 4 of the present disclosure.

By comparing shapes of the quantum dot structures 10 in FIGS. 7 and 12, it can be seen that the second quantum dot array 11 disappears, and the first quantum dot array 21 keeps the initial state. This is because the annealing temperature in the present embodiment is higher than the annealing temperature in Embodiment 1, and the annealing time is longer than the annealing time in Embodiment 1, and thus, the quantum dots in the region that is not covered by the patterned array are caused to be mutually mixed and diffused seriously and caused to disappear. Since the method of providing the patterned array in the present embodiment is a laser direct writing, and the characteristic size of the obtained patterned array is larger, the plurality of quantum dots covered by the patterned array still keeps the initial state.

In summary, it can be seen that the method of providing the patterned array, the annealing temperature and the annealing time each may cause effect on a shape of the finally obtained quantum dot structure, and thus, it is possible to manufacture a quantum dot structure of which the density and position can be controlled by selecting different methods of providing the patterned array and controlling the annealing temperature and the annealing time of the intermediate body.

Thus, those skilled in the art will understand that it is possible to manufacture and obtain a quantum dot structure of which a second quantum dot array and a third quantum dot array commonly exist by providing a patterned array having a smaller characteristic size and controlling a lower annealing temperature and shorter annealing time.

Although the present invention has been described with reference to the special embodiments, those skilled in the art will understand: various changes in form and details may be made herein without departing from the spirit and scope of the invention as defined by the following claims and its equivalents.

What is claimed is:

1. A manufacturing method of a quantum dot structure, comprising:
   providing a quantum dot film layer on a substrate;
   providing a first protection film on the quantum dot film layer;
   providing a patterned array on the first protection film;
   providing a second protection film on the first protection film and the patterned array to obtain an intermediate body; and
   performing an annealing process on the intermediate body to obtain the quantum dot structure on the substrate.

2. The manufacturing method of claim 1, wherein a material of the patterned array is selected from any one of $TiO_2$, Al, $HfO_2$, $Si_3N_4$ and $SrTiO_3$; and a thickness of the patterned array is 40 nm~300 nm, and a length and/or width of the patterned array is 10 nm~10 μm.

3. The manufacturing method of claim 1, wherein materials of the first protection film and the second protection film each are $SiO_2$; and a thickness of the first protection film is 5 nm~50 nm, and a thickness of the second protection film is 50 nm~300 nm.

4. The manufacturing method of claim 1, wherein an annealing temperature for performing an annealing process on the intermediate body is 550° C.~1000° C., and annealing time is 30 s~10 min.

5. The manufacturing method of claim 1, wherein a material of the quantum dot film layer is selected from any one of InAs, InGaAs, InGaAlAs, InSb, GaSb and InP;
   a growing temperature of the quantum dot film layer is 300° C.~550° C.; a thickness of the quantum dot film layer is 1.4 ML~10 ML; and a density of a quantum dot in the quantum dot film layer is $10^8$ $cm^{-2}$~$10^{11}$ $cm^{-2}$.

6. The manufacturing method of claim 1, wherein the providing the patterned array on the first protection film specifically comprises:
   providing a precursor film layer on the first protection film;
   performing a patterning process on the precursor film layer by adopting a laser direct writing process, the precursor film layer becoming the patterned array and a precursor residual film surrounding around the patterned array; and
   peeling off the precursor residual film to form the patterned array on the first protection film.

7. The manufacturing method of claim 6, wherein a material of the precursor film layer is Ti; a thickness of the precursor film layer is 40 nm-300 nm; and a length and/or width of the patterned array is 100 nm~500 nm.

8. The manufacturing method of claim 1, wherein the providing the patterned array on the first protection film specifically comprises:
   providing a photoresist layer on the first protection film;
   performing a patterning process on the photoresist layer by adopting a photolithography process or an electron beam photolithography process, to form a concave hole matching with a shape of the patterned array;
   depositing a patterned film layer in the concave hole; and
   peeling off the photoresist layer to form the patterned array on the first protection film.

9. The manufacturing method of claim 8, wherein:
   a material of the patterned film layer is selected from any one of $TiO_2$, Al, $HfO_2$, $Si_3N_4$ and $SrTiO_3$;
   a thickness of the patterned film layer is 40 nm~300 nm;
   a length and/or a width of the patterned array is 200 nm~10 μm when performing the patterning process on the photoresist layer by adopting the photolithography process; and
   a length and/or a width of the patterned array is 10 nm~200 nm when performing the patterning process on the photoresist layer by adopting the electron beam photolithography process.

10. The manufacturing method of claim 1, wherein a material of the substrate is selected from any one of GaAs, GaSb and InP.

11. The manufacturing method of claim 2, wherein an annealing temperature for performing an annealing process on the intermediate body is 550° C.~1000° C., and annealing time is 30 s~10 min.

12. The manufacturing method of claim 3, wherein an annealing temperature for performing an annealing process on the intermediate body is 550° C.~1000° C., and annealing time is 30 s~10 min.

* * * * *